United States Patent
Jin

(10) Patent No.: US 10,269,585 B2
(45) Date of Patent: Apr. 23, 2019

(54) METHOD OF FORMING SUBSTRATES WITH A THROUGH VIA

(71) Applicant: CORNING INCORPORATED, Corning, NY (US)

(72) Inventor: Yuhui Jin, Painted Post, NY (US)

(73) Assignee: Corning Incorporated, Corning, NY (US)

(*) Notice: Subject to any disclaimer, the term of this patent is extended or adjusted under 35 U.S.C. 154(b) by 0 days.

(21) Appl. No.: 15/696,574

(22) Filed: Sep. 6, 2017

(65) Prior Publication Data
US 2018/0076052 A1 Mar. 15, 2018

Related U.S. Application Data

(60) Provisional application No. 62/385,447, filed on Sep. 9, 2016.

(51) Int. Cl.
*H05K 3/00* (2006.01)
*H01L 21/48* (2006.01)
(Continued)

(52) U.S. Cl.
CPC ........ *H01L 21/486* (2013.01); *B23K 26/0006* (2013.01); *B23K 26/0622* (2015.10); *B23K 26/53* (2015.10); *B32B 7/06* (2013.01); *B32B 17/06* (2013.01); *C03C 15/00* (2013.01); *C03C 23/0025* (2013.01); *H01L 21/481* (2013.01); *H01L 23/15* (2013.01); *H01L 23/49822* (2013.01); *H01L 23/49827* (2013.01); *H05K 3/002* (2013.01); *B23K 2101/40* (2018.08); *B23K 2103/54* (2018.08); *B23K 2103/56* (2018.08); *H05K 1/0306* (2013.01); *H05K 3/0029* (2013.01); *H05K 3/0097* (2013.01); *H05K 2201/10378* (2013.01); *H05K 2203/107* (2013.01); *Y10T 29/49124* (2015.01)

(58) Field of Classification Search
CPC ..... H01L 2224/32145; H01L 23/49827; H01L 21/76259; H01L 2221/68318; H01L 23/15; H05K 3/4038; Y10T 29/49155; Y10T 29/49124; Y10T 29/49165; Y10T 156/10
USPC .................. 29/829, 825, 846, 849, 852, 854
See application file for complete search history.

(56) References Cited

U.S. PATENT DOCUMENTS 8,533,942 B2  9/2013 Ohashi et al.
9,278,886 B2  3/2016 Boek et al.
(Continued)

FOREIGN PATENT DOCUMENTS

JP   2001106545 A   4/2001
JP   2005019576 A   1/2005

OTHER PUBLICATIONS

International Search Report and Written Opinion PCT/US2017/050203 dated Dec. 21, 2017.

*Primary Examiner* — Thiem Phan
(74) *Attorney, Agent, or Firm* — John P. McGroarty

(57) ABSTRACT

Methods of forming a via in substrates include etching a damage region extending through a thickness of a stack of a plurality of substrates removably bonded together. Each of the substrates in the stack has at least one surface removably bonded to a surface of another substrate in the stack, wherein when the substrates in the stack are debonded, each substrate has at least one surface that has a surface roughness (Ra) of less than or equal to about 0.6 nm.

11 Claims, 2 Drawing Sheets

(51) Int. Cl.
*H01L 23/15* (2006.01)
*H01L 23/498* (2006.01)
*B32B 7/06* (2019.01)
*B32B 17/06* (2006.01)
*C03C 15/00* (2006.01)
*C03C 23/00* (2006.01)
*B23K 26/00* (2014.01)
*B23K 26/0622* (2014.01)
*B23K 26/53* (2014.01)
*B23K 103/00* (2006.01)
*B23K 101/40* (2006.01)
*H05K 1/03* (2006.01)

(56) References Cited

U.S. PATENT DOCUMENTS

| | | | |
|---|---|---|---|
| 9,758,876 B2* | 9/2017 | Shorey | C03B 33/102 |
| 2014/0147623 A1 | 5/2014 | Shorey et al. | |
| 2014/0170378 A1 | 6/2014 | Bellman et al. | |
| 2015/0102498 A1* | 4/2015 | Enicks | H01L 21/486 |
| | | | 257/774 |
| 2015/0166395 A1 | 6/2015 | Marjanovic et al. | |

* cited by examiner

METHOD OF FORMING SUBSTRATES WITH A THROUGH VIA

CROSS-REFERENCE TO RELATED APPLICATIONS

This application claims the benefit of priority under 35 U.S.C. § 119 of U.S. Provisional Application Ser. No. 62/385,447 filed on Sep. 9, 2016, the content of which is relied upon and incorporated herein by reference in its entirety.

BACKGROUND

Field

The present disclosure generally relates to articles with a via and methods of forming a via in substrates. In particular, the present disclosure is directed to articles with a via and methods of forming a via in substrates that include etching processes that preserve the surface roughness (Ra) of a substrate.

Technical Background

An interposer may be used as an electrical interface in an electronic device, including devices having a radio frequency (RF) filter, to spread an electrical connection to a wider pitch or to reroute an electrical connection to a different electrical connection. Glass and glass ceramic interposers have become an attractive alternative to silicon and fiber reinforced polymers. This is due, in part, to the ability of glass to be formed in large thin sheets. However, with continuously thinner electronic devices, many applications require interposers to the have thicknesses of 300 μm or less. Such thin glass and glass ceramics can be difficult to handle in fabrication procedures because of the glass's/glass ceramic's fragility and lack of stiffness. To counteract the fragility and lack of stiffness, fabrication methods using a carrier to which the glass or glass ceramic substrate is bonded have been developed.

Van der Waals forces may be used to removably bond glass or glass ceramic articles to carriers. The energy of the removable bond is sufficient to survive flat panel fabrication, while remaining de-bondable. However, Van der Waals forces may produce weak bonds, if any, when the surface roughness (Ra) of the glass or glass ceramic article is too high.

Accordingly, a need exists for methods for forming vias in substrates while preserving low surface roughnesses (Ra) such that the substrates may be removably bonded to carriers.

SUMMARY

In a first aspect, a method of forming substrates with a through via includes etching a damage region extending through a thickness of a stack of a plurality of substrates removably bonded together. Each of the substrates in the stack has at least one surface removably bonded to a surface of another substrate in the stack, wherein the surface of each of the plurality of substrates removably bonded to a surface of another one of the plurality of substrates has a surface roughness (Ra) of less than or equal to about 0.6 nm upon debonding the plurality of substrates.

A second aspect according to the first aspect, further including debonding the plurality of substrates.

A third aspect according to the first or second aspect further including creating at least one damage region extending through the thickness of the stack prior to etching.

A fourth aspect according to the third aspect, wherein creating the at least one damage region within the stack includes applying a laser pulse to the stack to create the at least one damage region.

A fifth aspect according to any one of the first through fourth aspects, wherein the surface of each of the plurality of substrates removably bonded to a surface of another one of the plurality of substrate has a surface roughness (Ra) of less than or equal to about 0.5 nm upon debonding the plurality of substrates.

A sixth aspect according to any one of the first through fourth aspects, wherein the surface of each of the plurality of substrates removably bonded to a surface of another one of the plurality of substrate has a surface roughness (Ra) of less than or equal to about 0.4 nm upon debonding the plurality of substrates.

A seventh aspect according to any one of the first through sixth aspects, wherein the plurality of substrates is removably bonded together using Van der Waals forces.

An eighth aspect according to any one of the first through seventh aspects, further including creating at least one damage region through the thickness of each of the plurality of substrates before they are removably bonded, wherein the at least one the damage region through the thickness of each of the plurality of substrates is aligned in the stack.

A ninth aspect according to any one of the first through eighth aspects, wherein the plurality of substrates is selected from a group consisting of glass, glass-ceramic, ceramic, and combinations thereof.

A tenth aspect according to any one of the first through ninth aspects, wherein the damage region extending through a thickness of a plurality of substrates removably bonded together in a stack is etched with an etching solution comprising hydrofluoric acid.

An eleventh aspect according to any one of the first through tenth aspects, wherein the stack consists of two or more substrates removably bonded together.

In an twelfth aspect, a method of forming substrates with a via includes etching a damage region in a stack, wherein the stack includes a plurality of substrates including a first substrate and at least one additional substrate, wherein each of the plurality of substrates has at least one surface removably bonded to a surface of another of the plurality of substrates. The damage region extends through the entire thickness of the at least one additional substrate, and the etching forms a through via in the at least one additional substrate and the etching forms a blind via in the first substrate. The at least one surface of each of the plurality of substrates removably bonded to the surface of another of the plurality of substrates has a surface roughness (Ra) of less than or equal to about 0.6 nm upon debonding the plurality of substrates.

A thirteenth aspect according to the twelfth aspect, wherein the damage region of the first substrate extends through only a portion of the first substrate.

A fourteenth aspect according to the twelfth aspect, wherein the damage region of the first substrate extends through the first substrate and only a portion of the damage region is etched to form the blind via.

A fifteenth aspect according to any one of the twelfth through fourteenth aspects, further including debonding plurality of substrates from one another.

A sixteenth aspect according to any one of the twelfth through fifteenth aspects, further including creating at least one damage region extending through the thickness of the stack prior to etching.

A seventeenth aspect according to any one of the twelfth through sixteenth aspects, wherein creating at least one damage region within the stack comprises applying a laser pulse to the bonded wafer pair to create the at least one damage region.

A eighteenth aspect according to any one of the twelfth through seventeenth aspects, wherein the plurality of substrates is bonded together using Van der Waals forces.

A nineteenth aspect according to any one of the twelfth through fourteenth aspects, further including creating at least one damage region extending through a portion of a thickness of the first substrate and creating at least one damage region extending through the entire thickness of the at least one additional substrate disposed, wherein when the first substrate and the at least one additional substrate are removably bonded together, the at least one damage region in the first substrate is aligned with the at least one damage region in the at least one additional substrate.

A twentieth aspect according to any one of the twelfth through nineteenth aspects, wherein the plurality of substrates is selected from a group consisting of glass, glass-ceramic, ceramic, and combinations thereof.

A twenty-first aspect according to any one of the twelfth through twentieth aspects, wherein the damage region of the stack is etched with an etching solution comprising hydrofluoric acid.

A twenty-second aspect according to any one of the twelfth through twenty-first aspects, wherein the stack consists of two or more substrates removably bonded together.

In a twenty-third aspect, a glass-based substrate includes a first surface having a surface roughness (Ra) of less than or equal to about 0.6 nm, a second surface, and at least one via extending from the first surface, wherein the glass-base substrate has a thickness of 200 μm or less.

A twenty-fourth aspect according to the twenty-third aspect, wherein the glass-based substrate is glass or glass-ceramic.

A twenty-fifth aspect according to the twenty-third or twenty-fourth aspect, wherein the at least one via is a through via that extends from the first surface to the second surface.

A twenty-sixth aspect according to any one of the twenty-third through twenty-fifth aspects, wherein the at least one via is a blind via.

A twenty-seventh aspect according to any one of the twenty-third through twenty-sixth aspects, wherein an electrically conductive material is disposed in the at least one via.

In a twenty-eighth aspect, a stack includes a plurality of substrates removably bonded together with at least one through via extending through a thickness of the stack. Each of the plurality of substrates has a surface removably bonded to a surface of another one of the plurality of substrates. And, the surface of each of the plurality of substrates removably bonded to a surface of another one of the plurality of substrates has a surface roughness (Ra) of less than or equal to about 0.6 nm upon debonding the plurality of substrates.

A twenty-ninth aspect according to the twenty-eighth aspect, wherein the stack consists of two or more substrates removably bonded together.

A thirtieth aspect according to the twenty-eighth or twenty-ninth aspect, wherein the plurality of substrates is bonded together using Van der Waals forces.

In a thirty-first aspect a stack including a plurality of substrates including a first substrate and at least one additional substrate, at least one blind via in the first substrate, at least one through-via in the at least one additional substrate, wherein each of the plurality of substrates has a surface removably bonded to a surface of another one of the plurality of substrates, and wherein the surface of each of the plurality of substrates removably bonded to a surface of another one of the plurality of substrates has a surface roughness (Ra) of less than or equal to about 0.6 nm upon debonding the plurality of substrates.

A thirty-second aspect according to the thirty-first aspect, wherein the stack consists of two or more substrates removably bonded together.

A thirty-third aspect according to the thirty-first or thirty-second aspect, wherein the plurality of substrates is bonded together using Van der Waals forces.

Additional features and advantages of the invention will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

The embodiments set forth in the drawings are illustrative and exemplary in nature and are not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
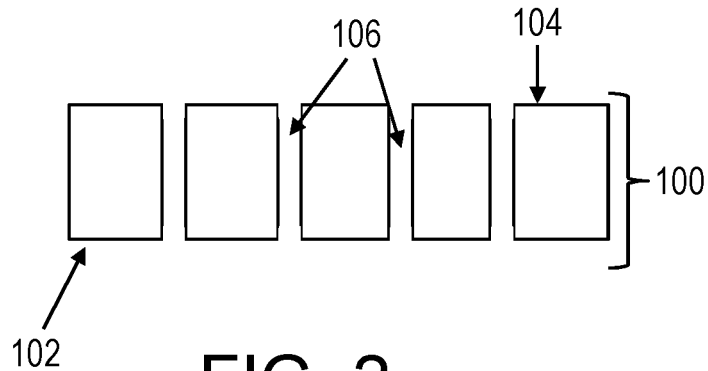
FIG. 1 illustrates an exemplary cross-sectional view of an article achieved through the processes described herein.

Referring generally to the figures, embodiments of articles with at least one via and methods of creating at least one via in substrates provided herein allow for the preservation of surface roughness (Ra) of substrates so that the substrates may be removably bonded to carriers for further processing. Reference will now be made in detail to various embodiments of articles with at least one via and methods of forming at least one via in substrates, examples of which are illustrated in the accompanying drawings. Whenever possible, the same reference numerals will be used throughout the drawings to refer to the same or like parts. It is noted that the embodiments illustrated in the figures are not to scale and that relative sizes and widths were selected for illustrative purposes only.

The articles disclosed herein may be used, for example, as an interposer in a semiconductor package, the articles having etched holes (e.g., vias) and surface attributes which allow for successful downstream processing including, but not limited to, via metallization and application of redistribution layers (RDL) for semiconductor devices, radio-frequency (RF) devices (e.g., antennae, switches, and the like), interposer devices, microelectronic devices, optoelectronic devices, microelectronic mechanical system (MEMS) devices and other applications where vias may be leveraged. Typically, glass or glass ceramic interposers require vias (holes) to be filled with electrically conductive material to provide electrical interfacing. An exemplary method of creating vias in glass or glass ceramic substrates is by creating a damage region through the thickness of the glass or glass ceramic substrate and then submerging to substrate into an etchant. The etchant may then remove material from the damage region to enlarge the hole. However, the etching process is not selective and material may be removed from both faces of the interposer as well as enlarging the hole. This invariably creates an increase in surface roughness (Ra). The articles may be removably/temporarily bonded to a carrier for downstream processing and if the surface roughness (Ra) of the substrate is increased too much it will be outside of the range for which a removable bond, for example Van der Waals bonding, can be appropriately formed.

Embodiments preserve a pre-etch surface roughness of at least one surface of a substrate by removably bonding a surface of one substrate to a surface of another before etching the removably bonded substrates for via formation. By preserving the low surface roughness of the substrate during via formation, the substrate may be removably bonded to a carrier for further processing. After processing, the substrate may be removed from the carrier, such that the carrier may be reused for processing further substrates. Various embodiments of articles and methods for via formation are described in detail below.

FIG. 1 depicts an exemplary finished article 100. In some embodiments, finished article 100 may be a substrate having first and second opposing surfaces, 102, 104. Finished article 100 may have at least one via 106. While multiple vias 106 are shown in FIG. 1, this is merely exemplary and finished article 100 may have a single via 106. Via 106 in finished article 100 may be a through via extending through the entire thickness of the substrate 100, as shown in FIG. 1. In alternative embodiments, via 106 in finished article 100 may be blind via extending only a portion of the way through the substrate 100. In yet another embodiment, finished article 100 may have a combination of through via(s) and blind via(s). At least one surface 102, 104 of the finished article 100 has a surface roughness (Ra) of less than or equal to about 0.6 nm. In some embodiments, both first and second surfaces 102, 104 of the substrate 100 may have a surface roughness (Ra) of less than or equal to about 0.6 nm, less than or equal to about 0.5 nm, less than or equal to about 0.4 nm, less than or equal to about 0.3 nm, or less than or equal to about 0.2 nm. As used herein, the surface roughness ($R_a$) is defined as the arithmetic average of the differences between the local surface heights and the average surface height and can be described by the following equation:

$$R_a = \frac{1}{n}\sum_{i=1}^{n} |y_i|,$$

where $y_i$ is the local surface height relative to the average surface height. The surface roughness ($R_a$) may be measured using a surface profilometer available from Zygo where the surface roughness ($R_a$) in at least three sample areas of about 100 μm by 100 μm are measured and averaged.

Substrate 100 may be a glass-based substrate. Example glass-based substrate materials include, but are not limited to glass (including fused silica) and glass-ceramic. When the substrate is a glass is may be formed from various glass compositions including, without limitation, fused silica (e.g., at least 99% silica), borosilicate glasses, aluminosilicate glasses, alkali-aluminosilicate glasses, aluminoborosilicate glasses, alkali-aluminoborosilicate glasses, and soda lime glasses. Furthermore, substrate 100 may be strengthened (e.g., by an ion exchange process) or non-strengthened. Exemplary substrates may include, but are not limited to, Corning EAGLE XG® glass, Corning Gorilla® glass, Corning Lotus™ NXT glass, and Corning Willowy glass. In yet further embodiments, substrate 100 may be made from other materials such as ceramic. In some embodiments, substrate 100 may have a thickness in a range of from about 25 μm to about 3,000 μm, about 25 μm to about 2,000 μm, about 25 μm to about 1,000 μm, about 50 μm to about 3,000 μm, about 50 μm to about 2,000 μm, about 50 μm to about 1,000 μm, about 100 μm to about 3,000 μm, about 100 μm to about 2,000 μm, about 100 μm to about 1,000 μm, about 200 μm to about 3,000 μm, about 200 μm to about 2,000 μm, about 200 μm to about 1,000 μm, about 500 μm to about 3,000 μm, about 500 μm to about 2,000 μm, about 500 μm to about 1,000 μm, about 3,000 μm or less, about 2,000 μm or less, about 1,000 μm or less, about 500 μm or less, about 400 μm or less, about 300 μm or less, about 200 μm or less, or about 100 μm or less.

Figure 2:
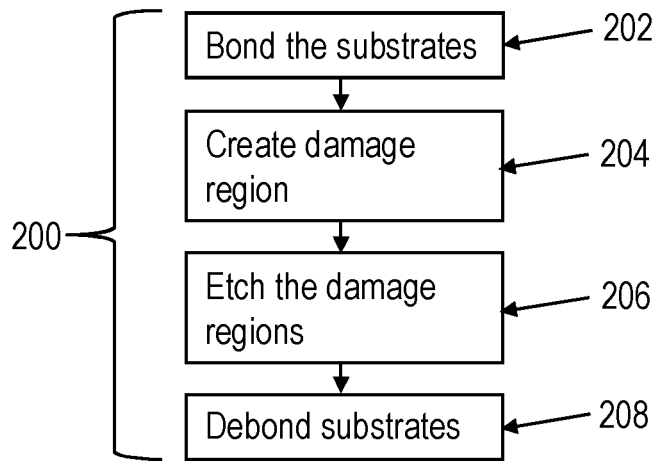
FIG. 2 illustrates an exemplary flowchart outlining a process for making an article with at least one via.

FIG. 2. depicts an exemplary flowchart 200 generally illustrating an exemplary process for forming at least one via in a substrate while maintaining the surface roughness ($R_a$) of at least one surface of the substrate. The steps depicted in the flowchart will be described in greater detail throughout the description of the various figures, but generally include a step 202 of bonding substrates, a step 204 of creating a damage region in the substrates, a step 206 of etching the damage regions, and a step 208 of debonding the substrates. It is noted that though flowchart 200 is depicted as having a certain order, it should be understood that embodiments of the present disclosure are not limited to the order of steps shown in FIG. 2.

Figure 3A:
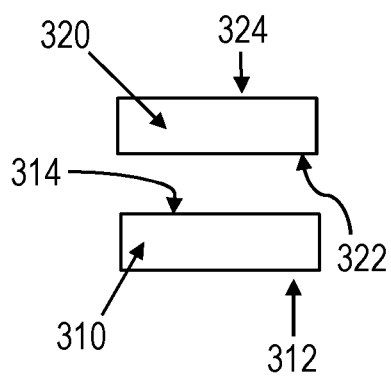
FIGS. 3A-3D illustrates exemplary cross-sectional views of substrates at various stages of the process for forming at least one via in the substrates.

Referring now to FIG. 3A, at least a first substrate 310 having opposing first and second surfaces 312, 314 and a second substrate 320 having opposing first and second surfaces 322, 324 a provided. In some embodiments, first surface 312, 322 and/or second surface 314, 324 may have a surface roughness (Ra) of less than or equal to about 0.6 nm, less than or equal to about 0.5 nm, less than or equal to about 0.4 nm, less than or equal to about 0.3 nm, or less than or equal to about 0.2 nm.

Figure 3B:
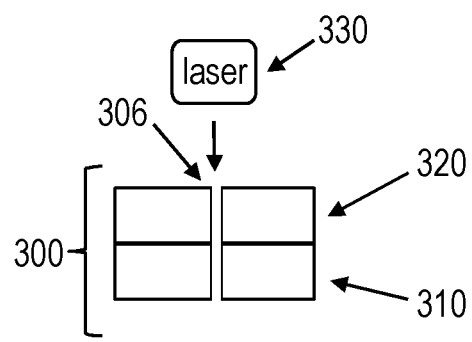
Figure 3C:
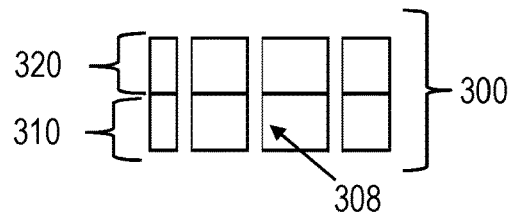

In some embodiments, as shown in FIG. 2, an exemplary step 202 in the process may be removably bonding surface 314 of a substrate 310 to surface 322 of another substrate 320 to form a stack of substrates. FIG. 3B depicts a stack 300 of substrates 310, 320 removably bonded together. While FIG. 3B depicts a stack of two substrates, more than two substrates can be removably bonded together in a stack. As used herein, a bond is removable if the bonded substrates can be debonded upon application of sufficient separation force without causing catastrophic damage (e.g., breakage) of the substrates. One exemplary method of removably bonding substrates is by using Van der Waals bonding such as disclosed by U.S. Patent Publication No. 2014/0170378, which is hereby incorporated by reference in its entirety. Van der Waals bonding generally includes disposing a surface of a first article on a surface of a second article and raising the temperature of the first article followed by cooling it to room temperature. The result is the first and second substrates 310, 320 being removably bonded together in a stack, wherein the inner surfaces 314, 322 of the substrates in stack 300 bonded together have minimal exposure to an etching solution later on the process. As a result, a pre-etch surface roughness (Ra) of each of bonded surfaces 314, 322 is preserved after the etching process and/or minimally changed. In some embodiments, an adhesion energy of at least 200 mJ/m$^2$ is needed for sufficient Van der Waals bonding. As noted above, a surface roughness (Ra) of bonded surfaces 314, 322 after debonding is less than or equal to about 0.6 nm, less than or equal to about 0.5 nm, less than or equal to about 0.4 nm, less than or equal to about 0.3 nm, or less than or equal to about 0.2 nm. A surface roughness (Ra) of less than or equal to about 0.6 nm will permit an adhesion energy of least 200 mJ/m$^2$.

Figure 4:
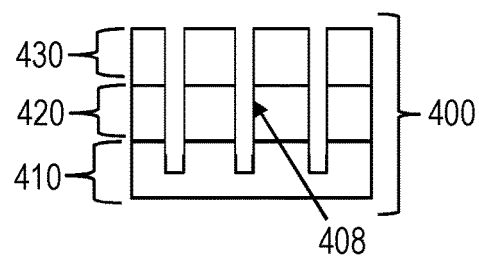
FIG. 4 illustrates an exemplary cross-sectional view of a stack of more three substrates removably bonded together.

While FIG. 3B illustrates a stack with two substrates removably bonded together, this is merely exemplary. Thus, in some embodiments, the stack may have more than two substrates removably bonded together, as shown for example in FIG. 4 where the stack 400 may be made of three or more substrates 410, 420, 430 removably bonded together.

In some embodiments, as shown in FIG. 2, step 204 may include creating at least one damage region 306 in stack 300 using a laser, as shown in FIG. 3B. In other embodiments, the at least one damage region 306 may be formed in each substrate before it is removably bonded to another substrate having at least one damage region to form a stack. In this embodiment, when a surface of a substrate having at least one damage region is removably bonded to a surface of another substrate having at least one damage region, the substrates are bonded such that their damage region(s) align. As indicated in FIG. 3B, the at least one damage region 306 may extend through the thickness of each of the substrates 310, 320. In an alternative embodiment (not shown), the at least one damage region may not extend through the entire thickness of the stack. In this embodiment, the at least one damage region extends through only a portion of a thickness of a first substrate 410, but extends through the entire thickness of each of substrates 420, 430 disposed on first substrate 410.

The at least one damage region 306 may be formed in a variety of ways. In some embodiments, the at least one damage region 306 may be created by applying a high energy laser pulse to ablate a narrow hole through the stack, allowing etchant to flow therein during downstream etching processes. In other embodiments, the at least one damage region 306 may not be a hole through the thickness of the substrates 310, 320 but rather a line of laser-induced damage formed by a pulsed laser. The pulsed laser may form the damage line by non-linear mullet-photon absorption, for example. The rate of material removal within the line of laser-induced damage defining the at least one damage region 306 is faster than the rate of material removal outside of the at least one damage region 306 during a subsequent etching process. Exemplary ways for performing the laser damage creation and subsequent etching are disclosed in U.S. Pat. No. 9,278,886 and U.S. Pub. No. 2015/0166395, each of which is hereby incorporated by reference in its entirety.

Figure 5:
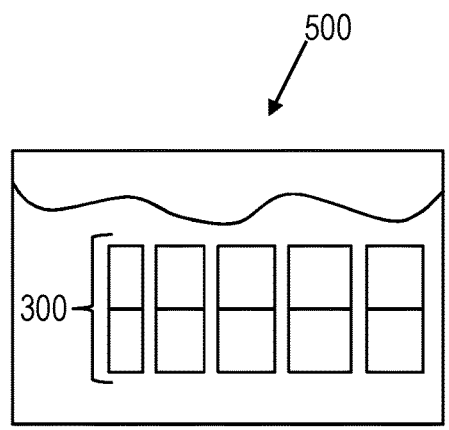
FIG. 5 illustrates an exemplary stack in an etchant bath.

Referring to block 206 of FIG. 2, the at least one damage region 306 in stack 300 may be etched to create a via 308 from damage region 306. As shown in FIG. 5, etching processes may include submerging stack 300 in an etchant 500 bath. Additionally or alternatively, etchant 500 may be sprayed onto the stack 300. Etchant 500 may remove material from substrates 310, 320 of stack 300 to enlarge a diameter of the at least one damage region 306 to create a via 308. Any suitable etchants may be utilized. Non-limiting examples of etchants include strong mineral acids such as nitric acid, hydrochloric acid, or phosphoric acid with a fluorine containing etchant such as hydrofluoric acid, ammonium bifluoride, sodium fluoride, and the like. Etchant may flow into damage regions 306 from first surface 312 of first substrate 310, second surface 324 of the second substrate 320, or both surfaces. In some embodiments, the etchant and/or stack may be agitated through, for example, but not limited to ultrasonic or megasonic vibration. As an example and not a limitation, via 308 may have a diameter in a range from about 5 μm to about 150 μm, about 20 μm to about 150 μm, or about 5 μm to about 20 μm. In some embodiments, a diameter of an opening of via 308 in surface 324 and a diameter of an opening of via 308 in surface 312 may be the same or may differ by 2 μm or less, such that via 306 is substantially cylindrical. In other embodiments, via 308 may have a cone shape and be symmetric only in a vertical direction.

Figure 3D:
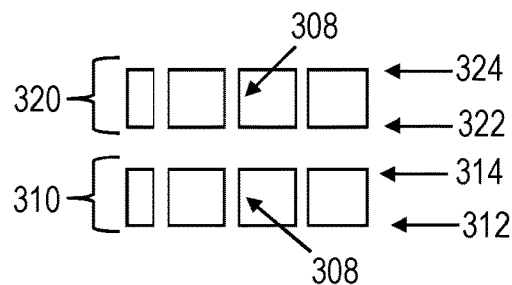

Referring to block 208 of FIG. 2, after via(s) 308 has been etched, substrates 310, 320 may be debonded, or separated. One exemplary method of debonding removably bonded substrates is by inserting a razor blade between the substrates as disclosed by U.S. Patent Publication No. 2014/0170378. After substrates 310, 320 have been debonded, at least the surfaces that were temporarily bonded together 314, 322 during the etching process will have a surface roughness (Ra) of less than or equal to about 0.6 nm because they were not exposed to the etchant. And in the embodiment shown in FIG. 3D, each substrate will have one or more through vias 308 that extend through the thickness of the substrate. In other embodiments, such as that shown in FIG. 4, at least one substrate may have at least one blind via (e.g., in substrate 410) that does not extend through the entire thickness of the substrate and at least one substrate may have at least one through via (e.g., substrates 420 and 430). As noted above, the blind via in first substrate 410 may be achieved by having the damage region corresponding to the blind via extends through only a portion of a thickness of first substrate 410, but extends through the entire thickness of each of substrates 420, 430 disposed on first substrate 410. Etching is performed such that the damage region in substrates 420, 430 turn into through vias and the damage region in first substrate 410 turns into a blind via. Alternatively, in some embodiments, when the damage region is a line of laser-induced damage, the damage region may extend through the entire thickness of first substrate 410, but the etching is controlled such that only a blind via is formed in first substrate 410. While not shown, in some embodiments, one or more substrates in a stack may have at least one blind via and at least one through via.

In some embodiments, as a result of the processes described herein, a glass-based article 100 is produced having a thickness of about 300 μm or less, 200 μm or less, or 100 µm or less with at least one via 106 extending from a surface having a surface roughness (Ra) of less than or equal to about 0.6 nm. In some embodiments, the at least one via 106 is a through via as shown in FIG. 1 and in other embodiments, the at least one via is a blind via. It is believed that a glass-based substrate with a thickness of 300 µm or less, 200 µm or less, or 100 µm or less with a surface having a surface roughness (Ra) of less than or equal to about 0.6 nm and a via extending from the surface would not be able to be achieved through traditional processes. For example, polishing or etching a surface of a glass-based substrate to a thickness of 300 µm or less, 200 µm or less, or 100 µm or less and a surface roughness (Ra) of less than or equal to about 0.6 nm would crack and/or break the glass-based substrate.

After via 308 has been etched and the substrates 310, 320 have been debonded, the substrates 310, 320 may be subjected to additional processing steps for acquiring additional properties. As discussed above, glass-based substrates may be very thin (e.g., anywhere from less than 200 µm up to 700 µm). Such thin material may be difficult to handle during fabrication procedures because of the fragility and lack of stiffness of the substrate 310. To counteract the fragility and lack of stiffness, the substrate 310 may be removably bonded to a carrier by disposing the second surface 314 of the substrate 310 on a bonding surface of a carrier. One exemplary method of removably bonding a substrate 310 to a carrier is by using Van der Waals bonding such as disclosed by U.S. Patent Publication No. 2014/0170378, as discussed above. Van der Waals bonding is beneficial to downstream processing because of its ability to form bonds that are capable of withstanding processing (e.g., high temperature processing), while allowing the entire area of the substrate to be removed (either all at once, or in sections) from the carrier. After the substrate 310 has been removed, the carrier may be reused for processing additional substrates.

The carrier may be of any suitable material, such as glass, for example. The carrier need not be glass, but instead may be ceramic, glass-ceramic, silicon or metal, for example. If made of glass, the carrier may be of any suitable composition including, but not limited to, aluminosilicate, borosilicate, aluminoborosilicate, soda lime silicate, and may be either alkali containing or alkali-free depending upon its ultimate application. The carrier may have any suitable thickness. Additionally, the carrier may be made of one layer or multiple layers (including multiple thin sheets) that are bonded together (e.g., by lamination). Furthermore, the coefficient of thermal expansion of the carrier may be substantially matched with that of substrate 310 to prevent warping of substrate 310 or decoupling of substrate 310 from the carrier during processing at elevated temperatures. The surface roughness (Ra) of substrate 310 is additive to the surface roughness of carrier. Therefore, in some embodiments, the carrier may have a surface roughness (Ra) less than or equal to 0.6 nm so that an adhesion energy of at least 200 mJ/m$^2$ may be achieved.

Once the substrate 310 is sufficiently bonded to the carrier such that the carrier and the substrate 310 will not separate during processing, the substrate 310 may be subjected to further processing. Processing the substrate 310 may include steps such as applying alkaline cleaning solutions to the substrate 310, wet etching the substrate 310, polishing the substrate 310, metal plating the substrate 310, metal patterning the substrate 310 by wet etching, depositing material onto the substrate 310 by deposition, filling vias 108 with an electrically conductive material, and annealing the substrate 310.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A method of forming substrates with a through via, the method comprising:
    etching a damage region extending through a thickness of a plurality of substrates removably bonded together in a stack to form a through via extending through the thickness of the stack,
    wherein each of the plurality of substrates has a surface removably bonded to a surface of another one of the plurality of substrates with an adhesion energy of greater than 200 mJ/m$^2$, and
    wherein the surface of each of the plurality of substrates removably bonded to a surface of another one of the plurality of substrates has a surface roughness (Ra) of less than or equal to about 0.6 nm upon debonding the plurality of substrates.

2. The method of claim 1, further comprising debonding the plurality of substrates.

3. The method of claim 1, further comprising creating at least one damage region extending through the thickness of the stack prior to etching.

4. The method of claim 3, wherein creating the least one damage region within the stack comprises applying a laser pulse to the stack to create the at least one damage region.

5. The method of claim 1, wherein the surface of each of the plurality of substrates removably bonded to a surface of another one of the plurality of substrate has a surface roughness (Ra) of less than or equal to about 0.5 nm upon debonding the plurality of substrates.

6. The method of claim 1, wherein the surface of each of the plurality of substrates removably bonded to a surface of another one of the plurality of substrate has a surface roughness (Ra) of less than or equal to about 0.4 nm upon debonding the plurality of substrates.

7. The method of claim 1, wherein the plurality of substrates is bonded together using Van der Waals forces.

8. The method of claim 1, further comprising:
    creating at least one damage region through the thickness of each of the plurality of substrates before they are removably bonded, and
    wherein the at least one damage region through the thickness of each of the plurality of substrates is aligned in the stack.

9. The method of claim 1, wherein the plurality of substrates is selected from a group consisting of glass, glass-ceramic, ceramic, and combinations thereof.

10. The method of claim 1, wherein the damage region extending through a thickness of a plurality of substrates removably bonded together in a stack is etched with an etching solution comprising hydrofluoric acid.

11. The method of claim 1, wherein the stack comprises two or more substrates removably bonded together.

* * * * *

UNITED STATES PATENT AND TRADEMARK OFFICE
CERTIFICATE OF CORRECTION

PATENT NO. : 10,269,585 B2
APPLICATION NO. : 15/696574
DATED : April 23, 2019
INVENTOR(S) : Yuhui Jin It is certified that error appears in the above-identified patent and that said Letters Patent is hereby corrected as shown below:

In the Claims

In Column 10, Line 32, Claim 4, delete "least" and insert -- at least --, therefor.

Signed and Sealed this
Tenth Day of September, 2019

Andrei Iancu
*Director of the United States Patent and Trademark Office*